US010567936B2

(12) United States Patent
Roa et al.

(10) Patent No.: US 10,567,936 B2
(45) Date of Patent: Feb. 18, 2020

(54) MOBILE APP FOR DESIGN MANAGEMENT FRAMEWORK

(75) Inventors: Humberto Roa, Bainbridge Island, WA (US); Ron Watson, Los Gatos, CA (US); James Horne, Melrose, CA (US); Yuriy Gorvitovskiy, Cupertino, CA (US); Chris Groves, Los Gatos, CA (US); Ravi Rangan, Bothell, WA (US)

(73) Assignee: Centric Software, Inc., Campbell, CA (US)

( * ) Notice: Subject to any disclaimer, the term of this patent is extended or adjusted under 35 U.S.C. 154(b) by 0 days.

(21) Appl. No.: 13/481,760

(22) Filed: May 25, 2012

(65) Prior Publication Data

US 2013/0137419 A1 May 30, 2013

Related U.S. Application Data

(60) Provisional application No. 61/490,047, filed on May 25, 2011.

(51) Int. Cl.
*H04W 4/00* (2018.01)
*H04W 4/50* (2018.01)

(52) U.S. Cl.
CPC ..................................... *H04W 4/50* (2018.02)

(58) Field of Classification Search
CPC ...... G06F 17/241; G06F 17/50; H04W 4/001; H04W 4/50
USPC ................................................. 455/418–420
See application file for complete search history.

(56) References Cited

U.S. PATENT DOCUMENTS

| | | | |
|---|---|---|---|
| 6,792,451 B1 | 9/2004 | Tomiyama | |
| 7,508,419 B2* | 3/2009 | Toyama et al. | 348/211.3 |
| 7,639,943 B1* | 12/2009 | Kalajan | 396/429 |
| 8,150,464 B2* | 4/2012 | Dey | 455/557 |
| 9,176,624 B2* | 11/2015 | Noda | G06F 3/0418 |
| 2006/0019699 A1 | 1/2006 | Chang et al. | |
| 2007/0002366 A1 | 1/2007 | Wang | |
| 2008/0021876 A1* | 1/2008 | Ahern et al. | 707/3 |
| 2008/0317346 A1* | 12/2008 | Taub | 382/182 |
| 2011/0061009 A1* | 3/2011 | Poisson | G06Q 20/201 715/764 |
| 2011/0153463 A1* | 6/2011 | Lovelace | 705/27.1 |
| 2012/0070045 A1* | 3/2012 | Vesper et al. | 382/128 |
| 2012/0141023 A1* | 6/2012 | Wang | H04N 1/00148 382/162 |
| 2012/0210200 A1* | 8/2012 | Berger | G06F 3/04845 715/202 |

FOREIGN PATENT DOCUMENTS

EP         2407894 A1      1/2012

\* cited by examiner

*Primary Examiner* — Liton Miah
(74) *Attorney, Agent, or Firm* — Aka Chan LLP

(57) ABSTRACT

Software allows images captured during product development on a mobile device (e.g., smartphone or other client device) to be uploaded to a design management system from the mobile device. Mark-up annotations and comments can be added to the images at the mobile device. Assignment of tasks related to the images can be made from the mobile device.

26 Claims, 21 Drawing Sheets

FIG. 14

SIZE SPECIFICATION
FIT REVIEW SESSION

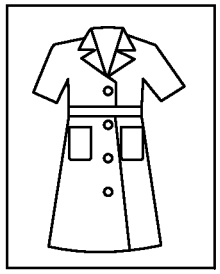

PRODUCT: SAFARI DRESS
REVIEWER: HUMBERTO ROA
DATE: 6/1/2012
PRODUCT STATUS: PROTOTYPE
PRODUCT SIZE: MEDIUM

| MEASUREMENT POINT | SPECIFICATION | ACTUAL | | % |
|---|---|---|---|---|
| A-1: BUST/CHEST, BELOW ARMHOLE | 5 1/2 IN | 6 IN | 📷 | +8% |
| A-2: BUST BACK PANEL | 10 IN | 9 3/4 IN | 📷 | -3% |
| B-1: SHOULDER SLOPE, FROM HPS | 20 IN | 20.5 IN | 📷 | +3% |
| B-2: SHOULDER WIDTH | 18 IN | 18 IN | 📷 | 0% |
| B3: FORWARD SHOULDER SEAM | 7 IN | 7 IN | 📷 | 0% |
| C-1: HPS TO WAIST POSITION | 5 1/2 IN | 6 IN | 📷 | +8% |
| C-2: WAIST, BODICE TOPS | 20 IN | 20.5 IN | 📷 | +3% |

| SPECIFICATIONS | MEASUREMENTS | TASKS |
|---|---|---|

MOBILE APP FOR DESIGN MANAGEMENT FRAMEWORK

CROSS-REFERENCE TO RELATED APPLICATIONS

This patent application claims the benefit of U.S. patent application 61/490,047, filed May 25, 2011, which is incorporated by reference along with all references cited in this application.

BACKGROUND OF THE INVENTION

This invention relates to software and more specifically to design management management software.

Consumer continually, demand new and improved products. To meet this demand, design development occurs at a rapid pace. Design management and product lifecycle management (PLM) software assists in the conception, design, realization, and servicing of products. A feature of software is images can be uploaded to a design management system from the desktop computer, after they have been transferred to the desktop computer from a camera.

Despite the success of design management software, improvements are still needed. With typical software, a shortcoming of the process is that the photos and images are typically taken while a user is away from their desk. For example, when a product prototype is received for review from a supplier, product developers will get up from their desk and walk over to the location of the prototype to review the prototype. As issues are discovered or as changes are requested, images will be captured with a camera to document the discussions.

To share the images with other product developers, a user will return to their desk, plug in their camera, and transfer (e.g., upload) the images to a design management system. After the images are uploaded, the user will then type in a description of the change as notes that are associated with the images. Also, a user can assign responsibility to another user to follow up on the change request by attaching the image to an email together with a description of the task. Also, if the user would like to draw a mark-up annotation on the image, the image must be opened in a mark-up application and saved back to the desktop before the image is uploaded.

Therefore, there is a need for software facilitating improved productivity.

BRIEF SUMMARY OF THE INVENTION

Software allows images captured during product development on a mobile device (e.g., smartphone or other client device) to be uploaded to a design management system from the mobile device. Mark-up annotations and comments can be added to the images at the mobile device. Assignment of tasks related to the images can be made from the mobile device.

Features include: Images can be uploaded directly to a design management system from the mobile device as they are taken at the location the discussion is taking place. Uploaded images can be attached to products that are managed in a design management system. Mark up annotations and comments can be added to the images directly from the mobile device. Responsibility for completing a task associated with the image can be assigned directly from the mobile device. Previously uploaded images and associated notes can be accessed from the mobile device. Previously assigned tasks can be accessed from the mobile device.

Embodiments of the invention contribute to enhanced productivity.

In an implementation, a method includes providing a design management system, where the design management system is accessible via the Internet; providing a mobile application for a smartphone having a camera and wireless connectivity to the Internet, where a user of the mobile application can remotely access the design management framework system; using the mobile application executing on the smartphone, allowing a first user of the design management system to take picture; allowing a first user to make an annotation to the picture; and synchronizing the mobile application with the design management system comprising uploading the picture with annotation to the design management system.

In another implementation, a method includes allowing a mobile application, executing on at least one processor of a mobile device including a camera, access a server of a design management system via a wireless network, where the design management system includes product specification, tasks, review for at least a first product; using the mobile application, allowing a first user to create a task and assigning to a second user; using the mobile application, selecting a picture to associate with the task; and automatically synchronizing the mobile application with the design management system including uploading the task to the design management system.

Other objects, features, and advantages of the present invention will become apparent upon consideration of the following detailed description and the accompanying drawings, in which like reference designations represent like features throughout the figures.

BRIEF DESCRIPTION OF THE DRAWINGS

Figure 14:
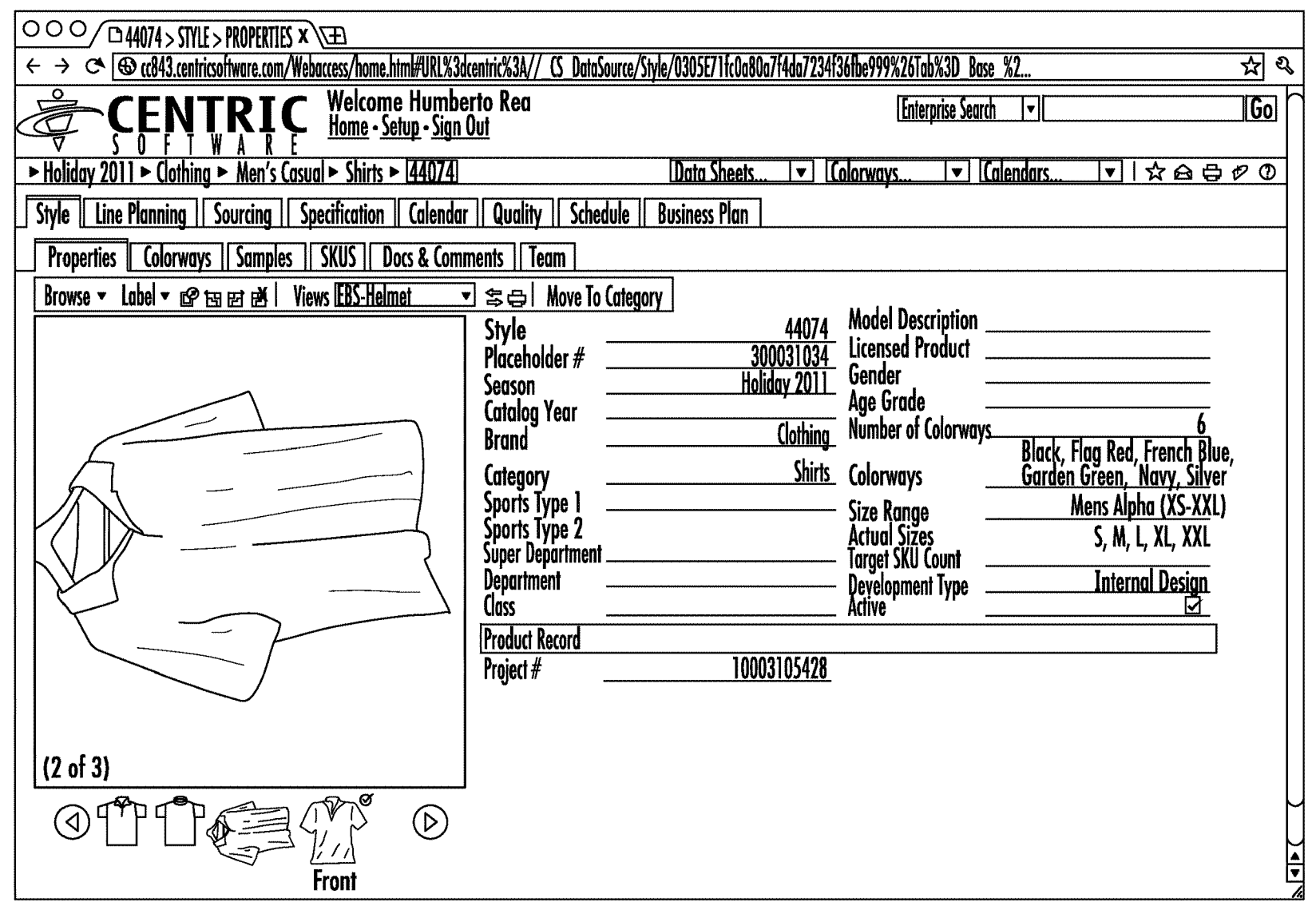

FIGS. 14-16 show screens from an application for a desktop or laptop client.

FIGS. 24-25 shows wire frame diagrams for mobile application screens.

FIG. 26 shows a screen for a specifications table for a desktop or laptop client.

DETAILED DESCRIPTION OF THE INVENTION

Figure 1:
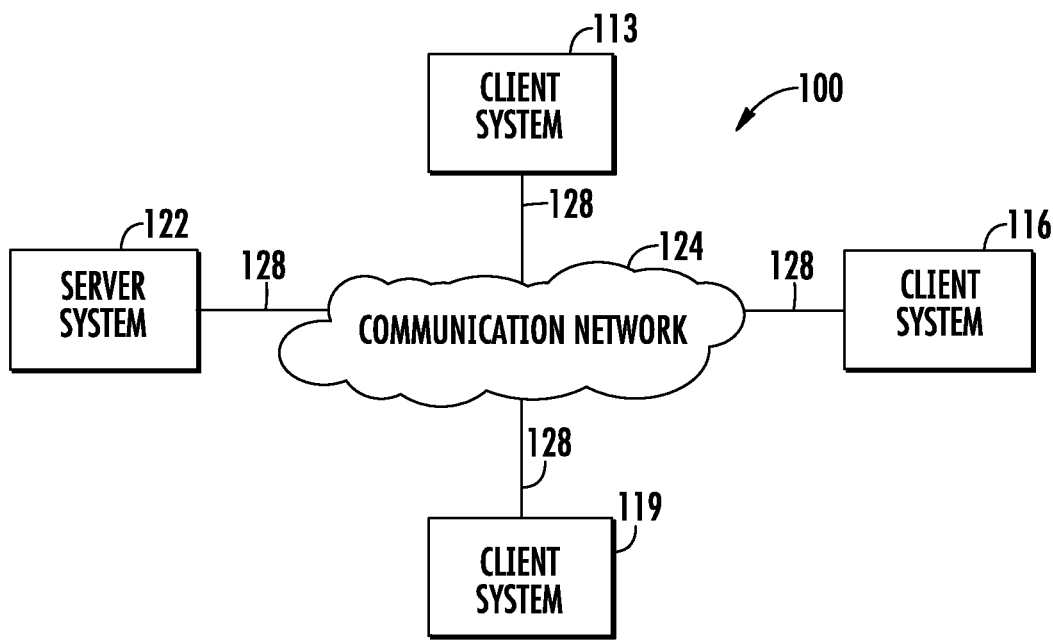
FIG. 1 shows a simplified block diagram of a design management system implemented in a distributed computing network connecting a server and clients.

FIG. 1 is a simplified block diagram of a distributed computer network 100 incorporating an embodiment of the present invention. Computer network 100 includes a number of client systems 113, 116, and 119, and a server system 122 coupled to a communication network 124 via a plurality of communication links 128. Communication network 124 provides a mechanism for allowing the various components of distributed network 100 to communicate and exchange information with each other.

Communication network 124 may itself be comprised of many interconnected computer systems and communication links. Communication links 128 may be hardwire links, optical links, satellite or other wireless communications links, wave propagation links, or any other mechanisms for communication of information. Various communication protocols may be used to facilitate communication between the various systems shown in FIG. 1. These communication protocols may include TCP/IP, HTTP protocols, wireless application protocol (WAP), vendor-specific protocols, customized protocols, and others. While in one embodiment, communication network 124 is the Internet, in other embodiments, communication network 124 may be any suitable communication network including a local area network (LAN), a wide area network (WAN), a wireless network, a intranet, a private network, a public network, a switched network, and combinations of these, and the like.

Distributed computer network 100 in FIG. 1 is merely illustrative of an embodiment incorporating the present invention and does not limit the scope of the invention as recited in the claims. One of ordinary skill in the art would recognize other variations, modifications, and alternatives. For example, more than one server system 122 may be connected to communication network 124. As another example, a number of client systems 113, 116, and 119 may be coupled to communication network 124 via an access provider (not shown) or via some other server system.

Client systems 113, 116, and 119 typically request information from a server system which provides the information. For this reason, server systems typically have more computing and storage capacity than client systems. However, a particular computer system may act as both as a client or a server depending on whether the computer system is requesting or providing information. Additionally, although aspects of the invention has been described using a client-server environment, it should be apparent that the invention may also be embodied in a stand-alone computer system.

Server 122 is responsible for receiving information requests from client systems 113, 116, and 119, performing processing required to satisfy the requests, and for forwarding the results corresponding to the requests back to the requesting client system. The processing required to satisfy the request may be performed by server system 122 or may alternatively be delegated to other servers connected to communication network 124.

According to the teachings of the present invention, client systems 113, 116, and 119 enable users to access and query information stored by server system 122. In a specific embodiment, a "web browser" application executing on a client system enables users to select, access, retrieve, or query information stored by server system 122. Examples of web browsers include the Internet Explorer browser program provided by Microsoft Corporation, and the Firefox browser provided by Mozilla, and others.

Figure 2:
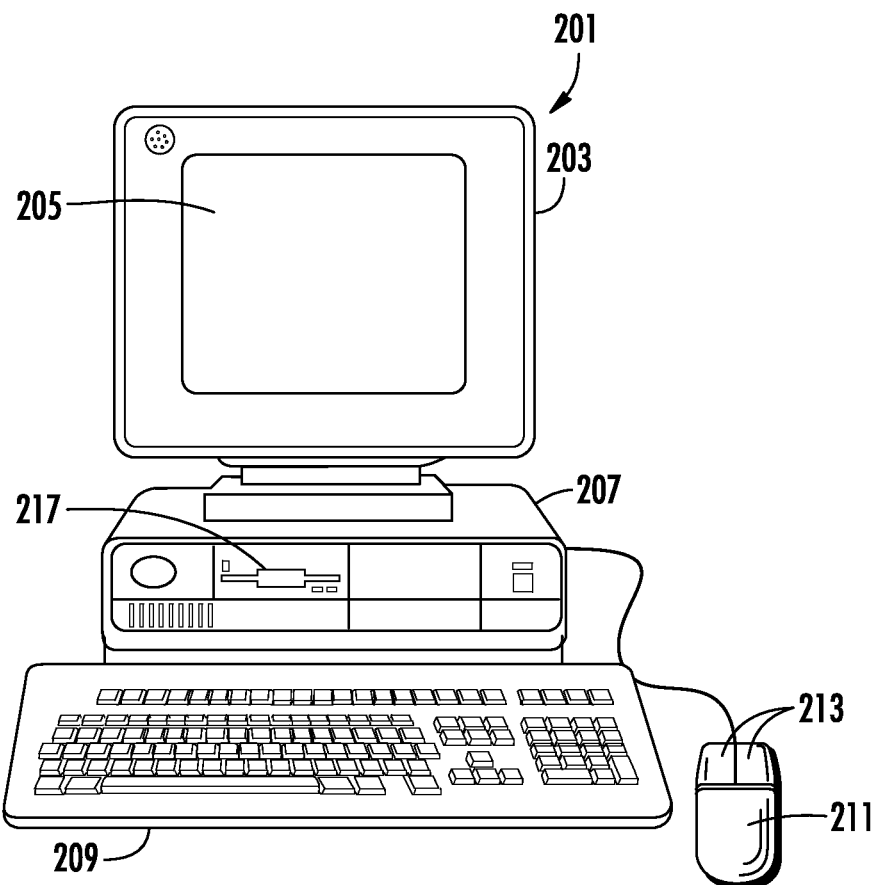
FIG. 2 shows a more detailed diagram of an exemplary client of the system.

FIG. 2 shows an exemplary client system of the present invention. In an embodiment, a user interfaces with the system through a computer workstation system, such as shown in FIG. 2. FIG. 2 shows a computer system 201 that includes a monitor 203, screen 205, enclosure 207 (may also be referred to as a system unit, cabinet, or case), keyboard or other human input device 209, and mouse or other pointing device 211. Mouse 211 may have one or more buttons such as mouse buttons 213.

Enclosure 207 houses familiar computer components, some of which are not shown, such as a processor, memory, mass storage devices 217, and the like. Mass storage devices 217 may include mass disk drives, floppy disks, magnetic disks, optical disks, magneto-optical disks, fixed disks, hard disks, CD-ROMs, recordable CDs, DVDs, recordable DVDs (e.g., DVD-R, DVD+R, DVD-RW, DVD+RW, HD-DVD, or Blu-ray Disc), flash and other nonvolatile solid-state storage (e.g., USB flash drive), battery-backed-up volatile memory, tape storage, reader, and other similar media, and combinations of these.

A computer-implemented or computer-executable version or computer program product of the invention may be embodied using, stored on, or associated with computer-readable medium. A computer-readable medium may include any medium that participates in providing instructions to one or more processors for execution. Such a medium may take many forms including, but not limited to, nonvolatile, volatile, and transmission media. Nonvolatile media includes, for example, flash memory, or optical or magnetic disks. Volatile media includes static or dynamic memory, such as cache memory or RAM. Transmission media includes coaxial cables, copper wire, fiber optic lines, and wires arranged in a bus. Transmission media can also take the form of electromagnetic, radio frequency, acoustic, or light waves, such as those generated during radio wave and infrared data communications.

For example, a binary, machine-executable version, of the software of the present invention may be stored or reside in RAM or cache memory, or on mass storage device 217. The source code of the software of the present invention may also be stored or reside on mass storage device 217 (e.g., hard disk, magnetic disk, tape, or CD-ROM). As a further example, code of the invention may be transmitted via wires, radio waves, or through a network such as the Internet.

Figure 3:
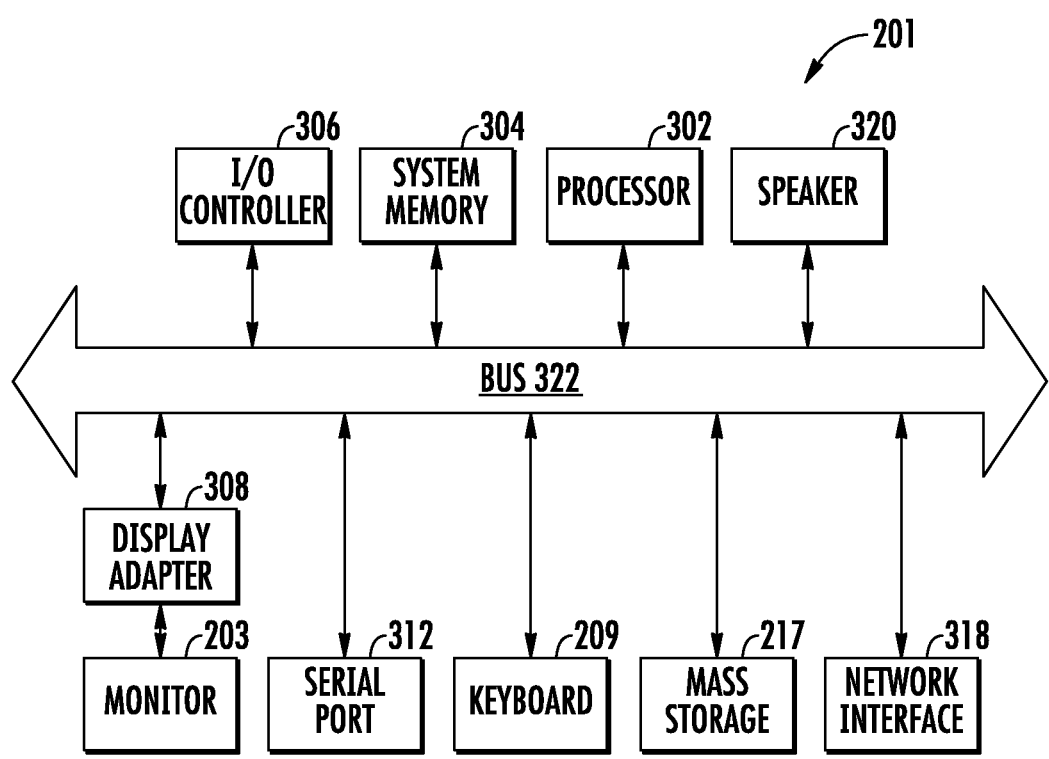
FIG. 3 shows a system block diagram of a client computer system used to execute an application program.

FIG. 3 shows a system block diagram of computer system 201 used to execute the software of the present invention. As in FIG. 2, computer system 201 includes monitor 203, keyboard 209, and mass storage devices 217. Computer system 501 further includes subsystems such as central processor 302, system memory 304, input/output (I/O) controller 306, display adapter 308, serial or universal serial bus (USB) port 312, network interface 318, and speaker 320. The invention may also be used with computer systems with additional or fewer subsystems. For example, a computer system could include more than one processor 302 (i.e., a multiprocessor system) or a system may include a cache memory.

Arrows such as 322 represent the system bus architecture of computer system 201. However, these arrows are illustrative of any interconnection scheme serving to link the subsystems. For example, speaker 320 could be connected to the other subsystems through a port or have an internal direct connection to central processor 302. The processor may include multiple processors or a multicore processor, which may permit parallel processing of information. Computer system 201 shown in FIG. 2 is but an example of a computer system suitable for use with the present invention. Other configurations of subsystems suitable for use with the present invention will be readily apparent to one of ordinary skill in the art.

Computer software products may be written in any of various suitable programming languages, such as C, C++, C#, Pascal, Fortran, Perl, Matlab (from MathWorks, www-.mathworks.com), SAS, SPSS, JavaScript, AJAX, and Java.

The computer software product may be an independent application with data input and data display modules. Alternatively, the computer software products may be classes that may be instantiated as distributed objects. The computer software products may also be component software such as Java Beans (from Sun Microsystems) or Enterprise Java Beans (EJB from Sun Microsystems).

An operating system for the system may be one of the Microsoft Windows® family of operating systems (e.g., Windows 95, 98, Me, Windows NT, Windows 2000, Windows XP, Windows XP x64 Edition, Windows Vista, Windows 7, Windows CE, Windows Mobile), Linux, HP-UX, UNIX, Sun OS, Solaris, Mac OS X, Alpha OS, AIX, IRIX32, or IRIX64. Other operating systems may be used. Microsoft Windows is a trademark of Microsoft Corporation.

Furthermore, the computer may be connected to a network and may interface to other computers using this network. The network may be an intranet, internet, or the Internet, among others. The network may be a wired network (e.g., using copper), telephone network, packet network, an optical network (e.g., using optical fiber), or a wireless network, or any combination of these. For example, data and other information may be passed between the computer and components (or steps) of a system of the invention using a wireless network using a protocol such as Wi-Fi (IEEE standards 802.11, 802.11a, 802.11b, 802.11e, 802.11g, 802.11i, 802.11n, and 802.11ac, just to name a few examples), near field communication (NFC), radio-frequency identification (RFID), mobile or cellular wireless (e.g., 2G, 3G, 4G, 3GPP LTE, WiMAX, LTE, Flash-OFDM, HIPERMAN, iBurst, EDGE Evolution, UMTS, UMTS-TDD, 1xRDD, and EV-DO). For example, signals from a computer may be transferred, at least in part, wirelessly to components or other computers.

In an embodiment, with a web browser executing on a computer workstation system, a user accesses a system on the World Wide Web (WWW) through a network such as the Internet. The web browser is used to download Web pages or other content in various formats including HTML, XML, text, PDF, and postscript, and may be used to upload information to other parts of the system. The web browser may use uniform resource identifiers (URLs) to identify resources on the web and hypertext transfer protocol (HTTP) in transferring files on the Web.

U.S. Pat. No. 7,012,602, issued Mar. 14, 2006, entitled "Virtual Three-Dimensional Display for Product Development" describes a software product that can be used by product development teams to access development information is an easy to use user interface. Embodiments of the invention described in this application can include features such as described in the '602 patent. The '602 patent is incorporated by reference along with all references cited in this application.

U.S. patent application 61/390,171, filed Oct. 5, 2010, is also incorporated by reference.

Figure 4:
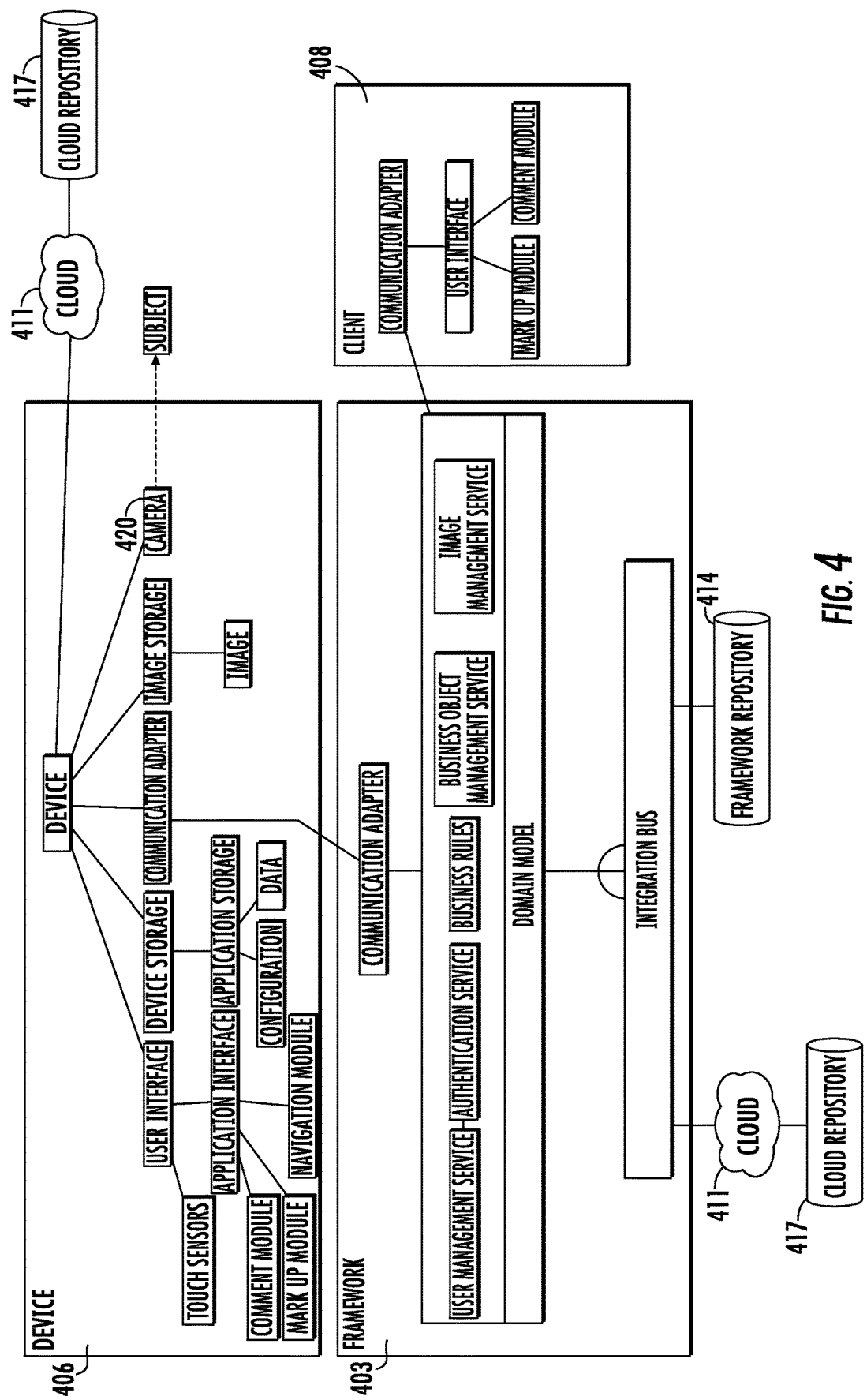
FIG. 4 shows a system diagram of an implementation of a design management system with mobile clients.

FIG. 4 shows a system diagram of an implementation of a design management system with clients. A software framework 403 of design management software connects to a device 406 and client 408. The framework includes components: a user management service, authentication service, business rules, business object management, and image management service. These components are associated with a domain model. The components are connected via a communications adapter to device 406. Via the domain model, the components are connected to an integration bus to connect to a cloud 411 and framework repository 414. Cloud 411 is connected to a cloud repository 417.

The software framework can be implemented as server software or as desktop software on a single machine. As server software, multiple clients can access the software via a network, including a local and wide area network (e.g., Internet).

Device 406 is a mobile electronic device such as a smartphone (e.g., Apple iPhone smartphone, Apple iPad tablet, or other Apple iOS device, or Google Android device) or other mobile device. Mobile device 406 is a computer. Device 406 typically has a small form factor that can more easily carried around by the user, such as carried from location to location to take pictures.

Client 408 is a computer. Compared to mobile device 406, computer 408 is workstation which the user uses to interface with the software framework. For example, device 406 can be a desktop or laptop computer. The desktop computer can include components as discussed above and shown in FIGS. 2 and 3. Generally, client 408 has greater processing power, memory and storage size, screen size, memory, and input capability than mobile device 406. The limitations of mobile device 406 prevent it from being able to execute or access the same version of the design management software which is available to client 408.

The mobile device includes a mobile processor such as an ARM processor or other microprocessor such as from Intel, AMD, or MIPS. ARM is a 32-bit reduced instruction set computer (RISC) instruction set architecture (ISA) developed by ARM Holdings. This processor is used to execute mobile application software which is stored on the device. Typically the device has in addition to RAM or volatile memory, Flash or other nonvolatile memory storage for the storage of mobile applications. The mobile device has mobile connectivity to the Internet.

Some components of mobile device 406 include a user interface, device storage, communications adapter, and image storage. The device includes a camera 420 or video camera. Images or pictures of a subject (e.g., product or item that is handled by the design software framework) can be taken with the camera can be uploaded wirelessly (e.g., Wi-Fi, 3G, 4G, or LTE) to the framework via cloud 411 to cloud repository 417. Once in the cloud repository, software framework 403 can access the images taken using the mobile device. And clients (e.g., client 408) having access to the software framework will be able to access the images.

Through the cloud (or communications adapter), the picture is synchronized with the software framework. In an implementation, the picture is transferred to the image repository (e.g., at a server). The picture will be accessible to the user through client 408 (when the user returns to the desk), and the mark-ups and comments made at the mobile device will be viewable.

The user interface of the mobile device can include touch sensors and other user input devices. Via the user interface, the user can access an application interface (e.g., iPhone or iPad app, or Android app) for the design management software. This interface can communicate with, for example, a comment module, mark-up module, and navigation module. For example, before uploading to the cloud, the user can add comments to the images or mark-up the images. These comments will be viewable by the users who have access to the framework (such as via client 408).

Mobile device 406 has device storage (e.g., magnetic storage, optical storage, Flash storage, or other computer readable media) which includes application storage for configuration and data. Computer 406 has a communications adapter which interfaces with the communication adapter of the software framework. Computer 406 has image storage to store images transferred from the camera. Computer 406 also has access to cloud 411 (e.g., network, Internet, and servers located through the network) and cloud repository 417 (e.g., remote storage accessible through the network).

The application interface on the mobile device may be via standalone, dedicated software executing on device, or the interface may be via a Web browser interface. The Web browser accesses the design management software as a cloud-based or server-based application (e.g., Java or Javascript code).

Client 408 has a communication adapter, which allows connecting to software framework 403. The client has a user interface for the design management software. The user interface includes two modules, a mark-up module and comment module. The user can connect an external camera, such as connected to the client via a port such as USB or FireWire.

Figure 5:
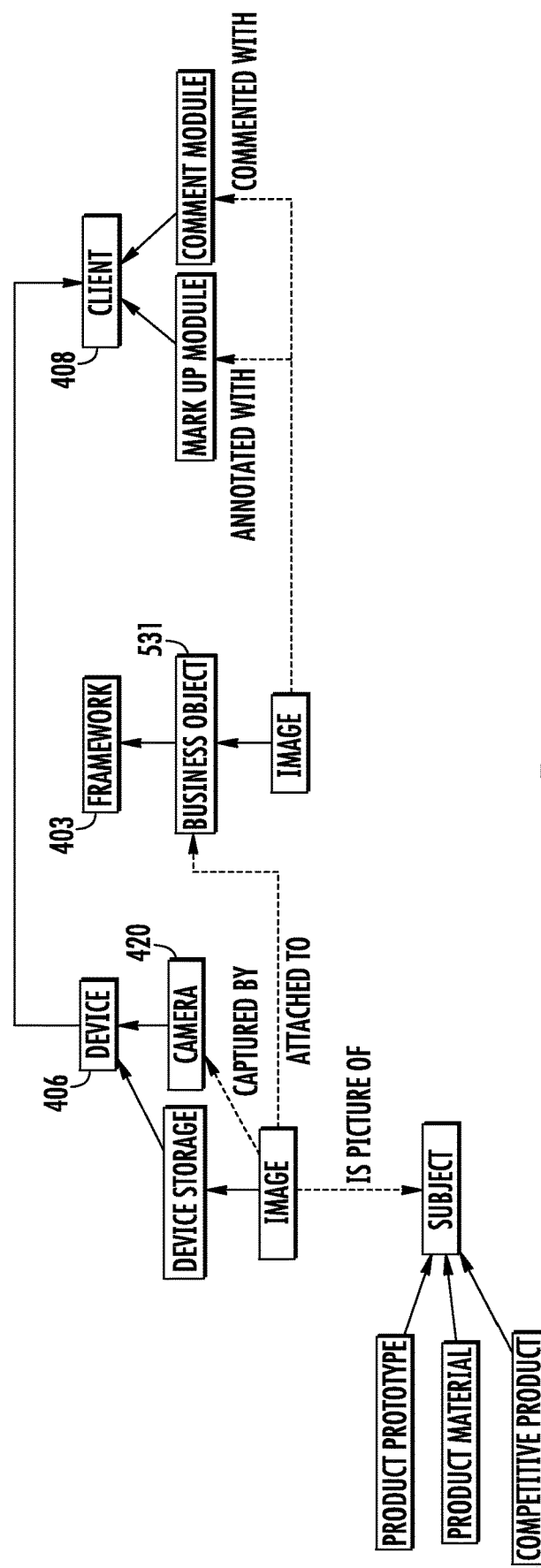
FIG. 5 shows further details of a system of an implementation of a design management system.

FIG. 5 shows further details of a system of an implementation of a design management system. The picture of the subject can be, for example, a product prototype, product material, or competitive product. This image is attached to a business object of framework 531.

Figure 15:
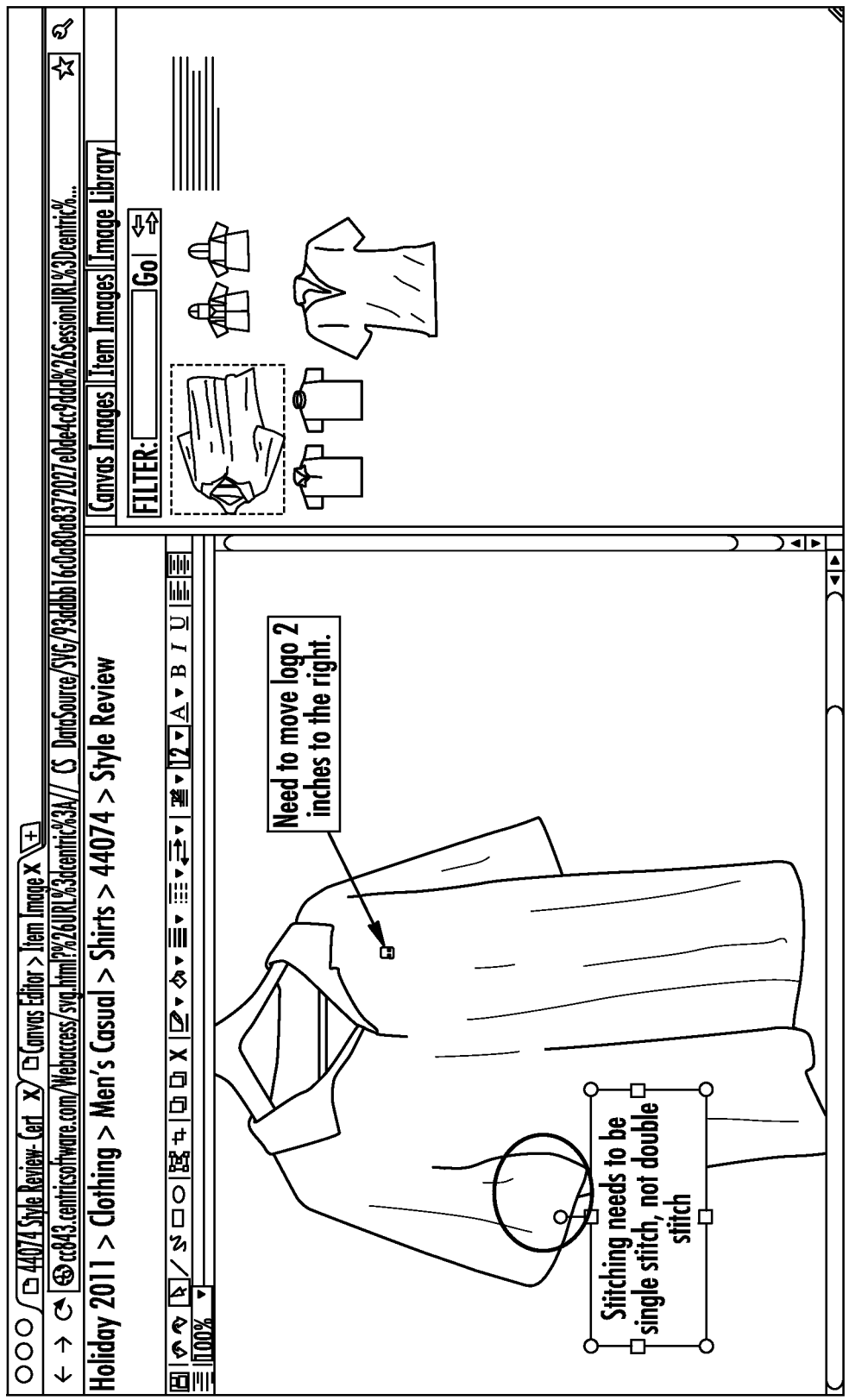
Figure 16:

FIGS. 6-16 show screen shots of software applications. FIGS. 6-13 show screens from an application for a mobile device 406 (e.g., iPhone, Android, or smartphone). FIGS. 14-16 show screens from an application on client 408 (e.g., workstation, desktop, or laptop computer).

Figure 6:
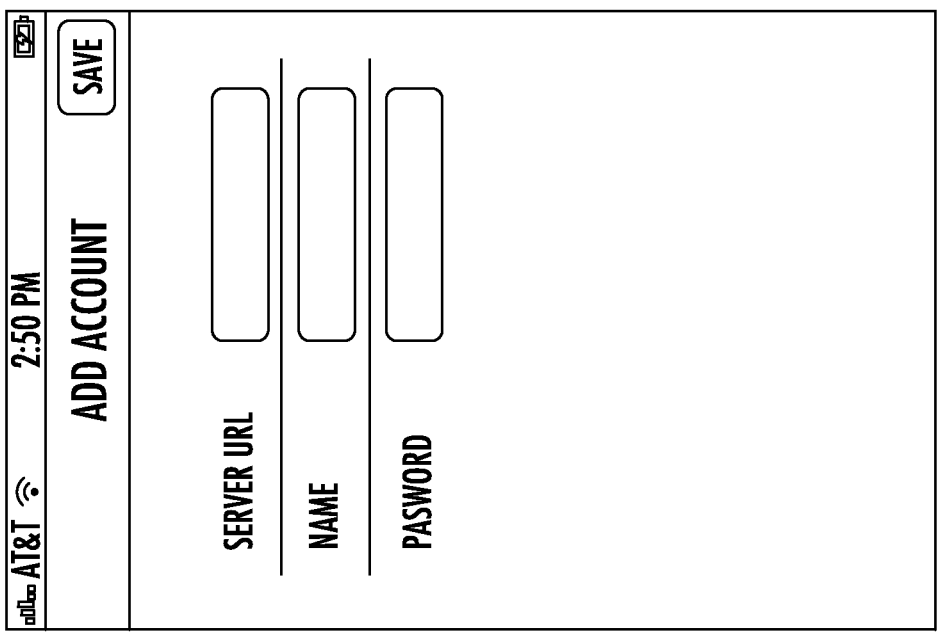

FIG. 6: The application allows a user to sign in using a user name and password that is related to a valid active account on the server. As part of the sign in process, the user needs to provide the address of the server that account and product information is managed on. This allows the user to use the same application to access information on different servers.

Figure 7:
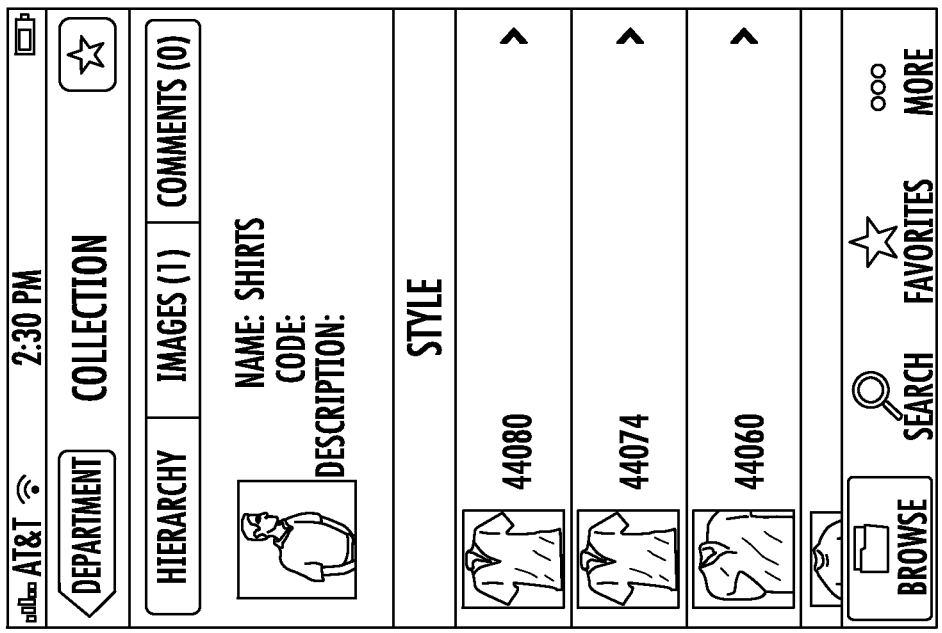
FIGS. 6-13 show screens from an application for a mobile device.

FIG. 7: After the user signs in, the user can access information that is managed on the server. For example, the user can browse the products that the development team is creating. The user can view the products directly, or browse the products in groups such as seasons or collections. The development team defines and assigns products to these groups.

The ability to access information is restricted by the privileges that have been granted to the user on the server. The user can only see information that has been made available to the user or to the role the user is in on the server.

The user can navigate the information. For example, the user can navigate to a product by selecting the image of the product or the name of the product. Also, the user can view relevant attributes about a product such as the name of the product, the code of the product, and the product's description. These attributes are stored on the server as part of the definition of the product.

Figure 8:
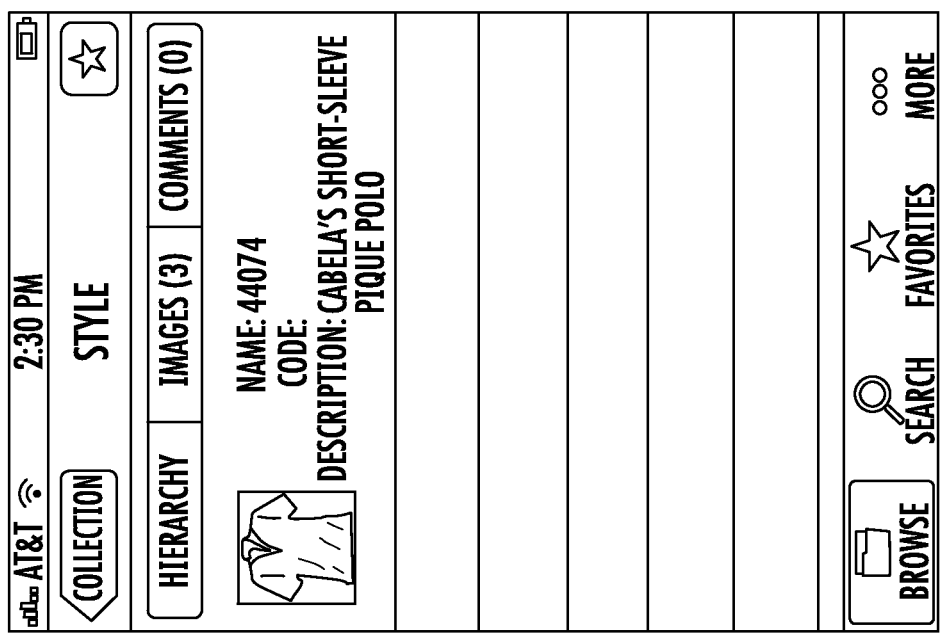

FIG. 8: For a given product, the user can access a view that contains the metadata information associated with the product, and the user can access files that are associated with the product like images. The user can view a set of the images associated with the product by selecting the navigation action associated with the view that displays the images.

Figure 9:
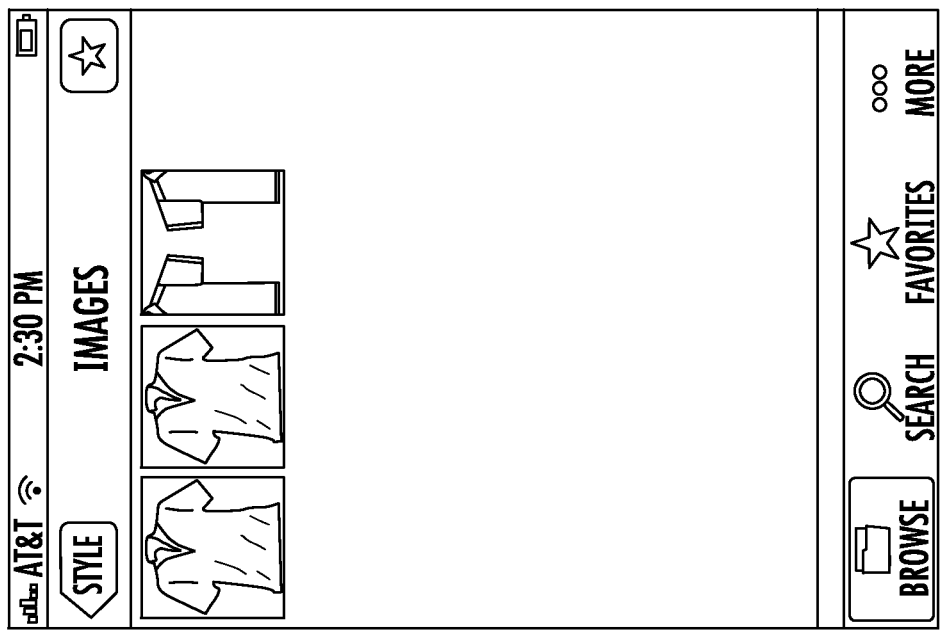

FIG. 9: If a user would like to add an image from the device to the product, the user starts with selecting an action to add a photo. For example, this action can be represented with a camera icon. Selection this action will result in the user being prompted for the source of the image. The user can decide to take a new photo using the camera on the device or to use an existing photo that is stored on the device. Another option would be to allow the user to select a in a storage location that is accessible by the device like a share folder on the network or storage location in the cloud.

Figure 10:
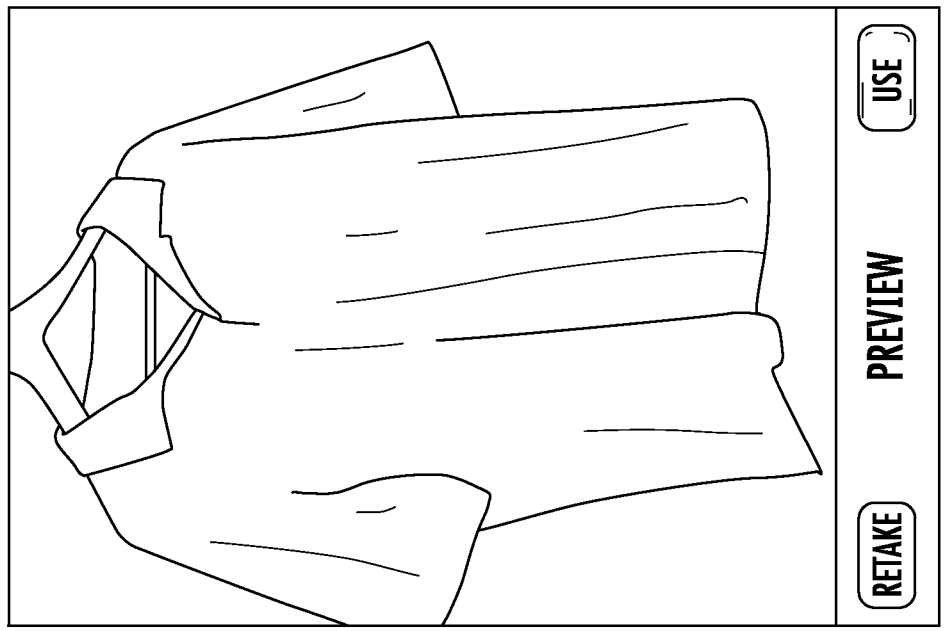

FIG. 10: If the user decides to take a new photo, the user will be able to view the subject of the photo in the application, and then the user can select an action to capture the photo. For example, the action to capture a photo can be triggered by a button labeled Use. Clicking the button will capture the photo, and upload the photo to the server where it will be attached to the product.

Figure 11:
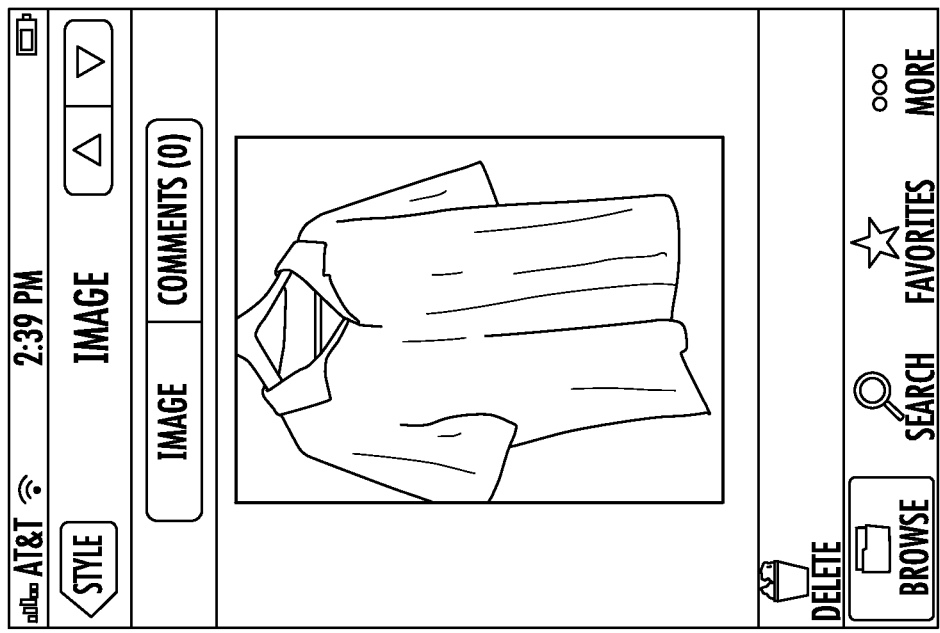

FIG. 11: After the image is uploaded to the server, the user will be able to view the image.

Figure 12:
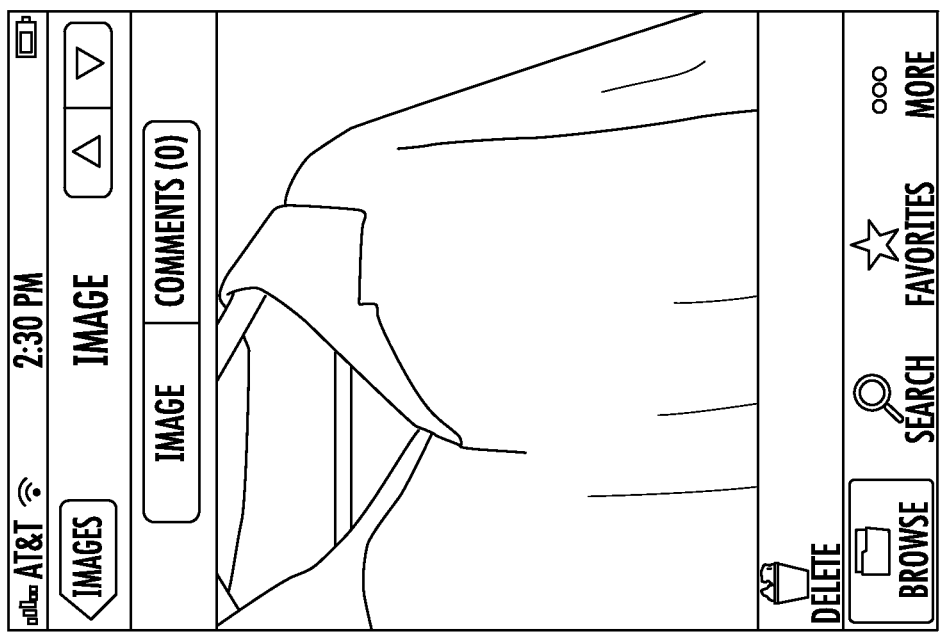

FIG. 12: The user can zoom into the image and pan the image in the display using gestures.

Figure 13:
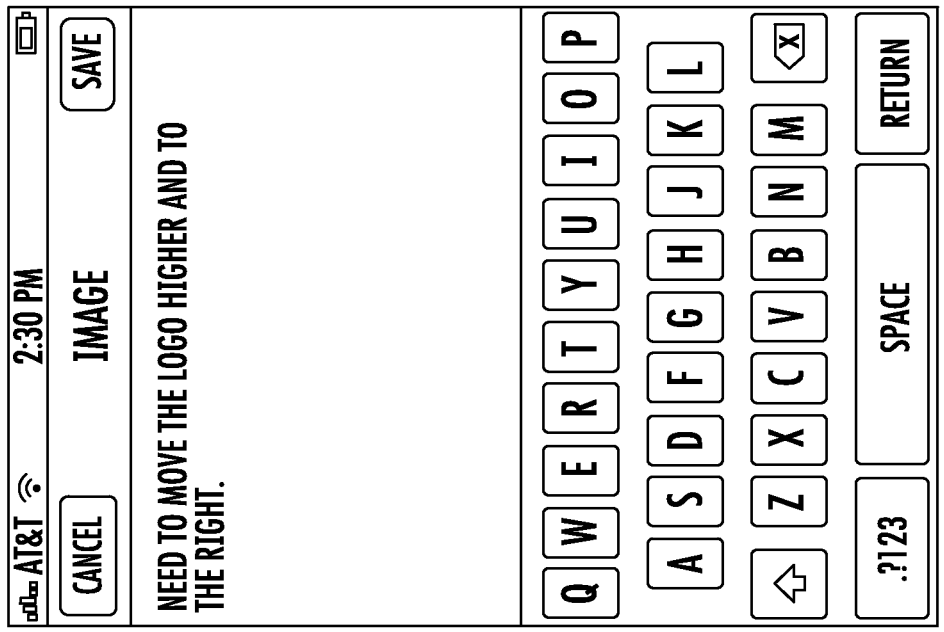

FIG. 13: The user can also add comments to the photo to communicate changes with others. Comments are stored on the server associated with the photo.

FIG. 14: After the photo is uploaded to the server, the user can view the photo by opening the associated product and then opening a view to browse the images.

FIG. 15: The user can add annotations and comments to the photo from the server. The user can create a new review session, add the photo to the review, and then draw annotations on top of the photo to capture and share feedback about the subject of the photo.

Annotation features include:

The annotation shapes that can be added include: (a) straight lines, (b) curved lines, (c) boxes, and (d) circles.

Annotation shapes can be adjusted by techniques including: (a) resizing, (b) selecting the fill color, (c) selecting the border color, (d) adding text, (e) adding arrow heads to the end of line shapes, and (f) changing the thickness and dash size for line shapes and borders.

The text associated to an annotation shape can be adjusted by techniques including: (a) selecting the font point size, (b) selecting the font type, (c) selecting the font weight, and (d) selecting the alignment.

These annotation features will also be available on the mobile device.

FIG. 16: The photo and annotations added during a review session can be added to a technical data sheet, which can be emailed or printed to share with others.

Figure 17:
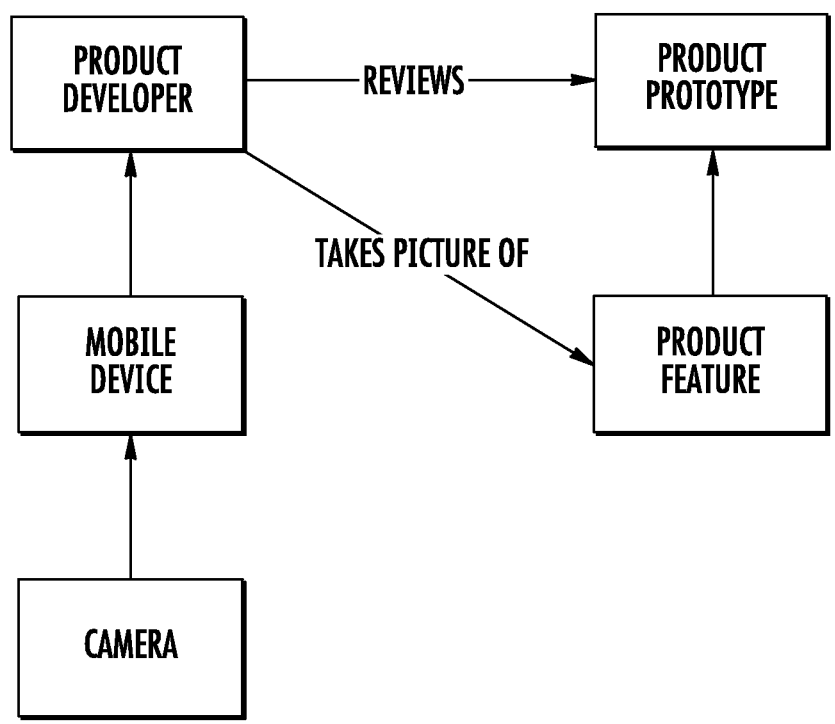
FIGS. 17-23 shows unified modeling language (UML) diagrams for an implementation of a design management system with mobile clients.
Figure 18:
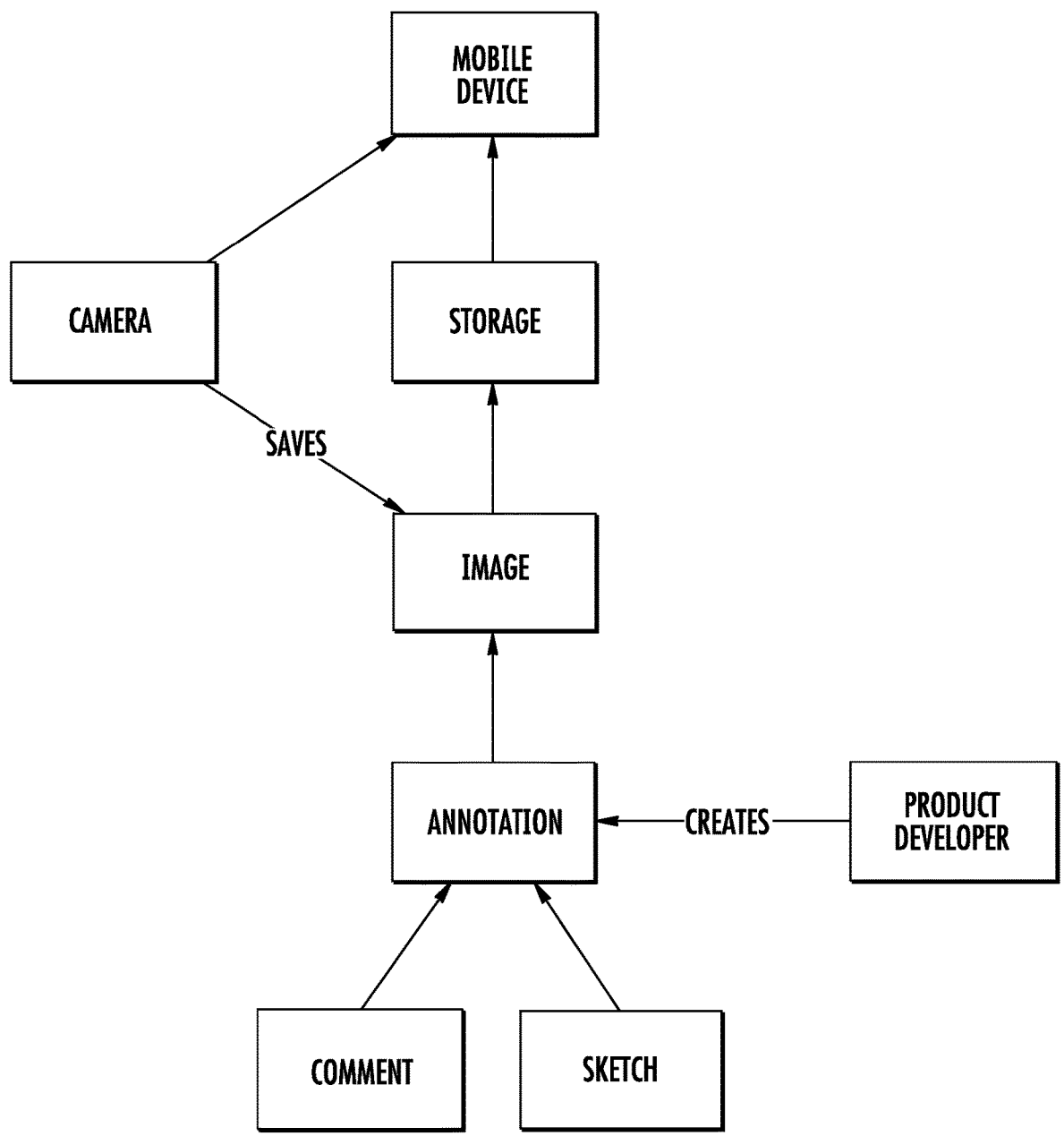

FIGS. 17-23 shows unified modeling language (UML) diagrams for an implementation of a design management system with mobile clients. FIG. 17 provides a product developer user with a mobile device application, executing on a smartphone, tablet, or other mobile device having a camera. The product developer can take a picture of a product feature (e.g., aspect of a product that the developer is developing). With the picture FIG. 18 provides the mobile device has a camera and storage (e.g., Flash or other nonvolatile storage and RAM). After taking an image or picture with the camera, the image can be stored in Flash memory. Using the mobile application executing on the mobile device, the user (e.g., product developer) can annotate the image with a comment or sketch. The sketch can be a handwritten using a touch screen interface making hand drawn markings on the image. A comment can be text input (e.g., ASCII text), such as input using an on-screen keyboard. Annotation is optional depending on whether the user wants to annotate of not.

Figure 19:
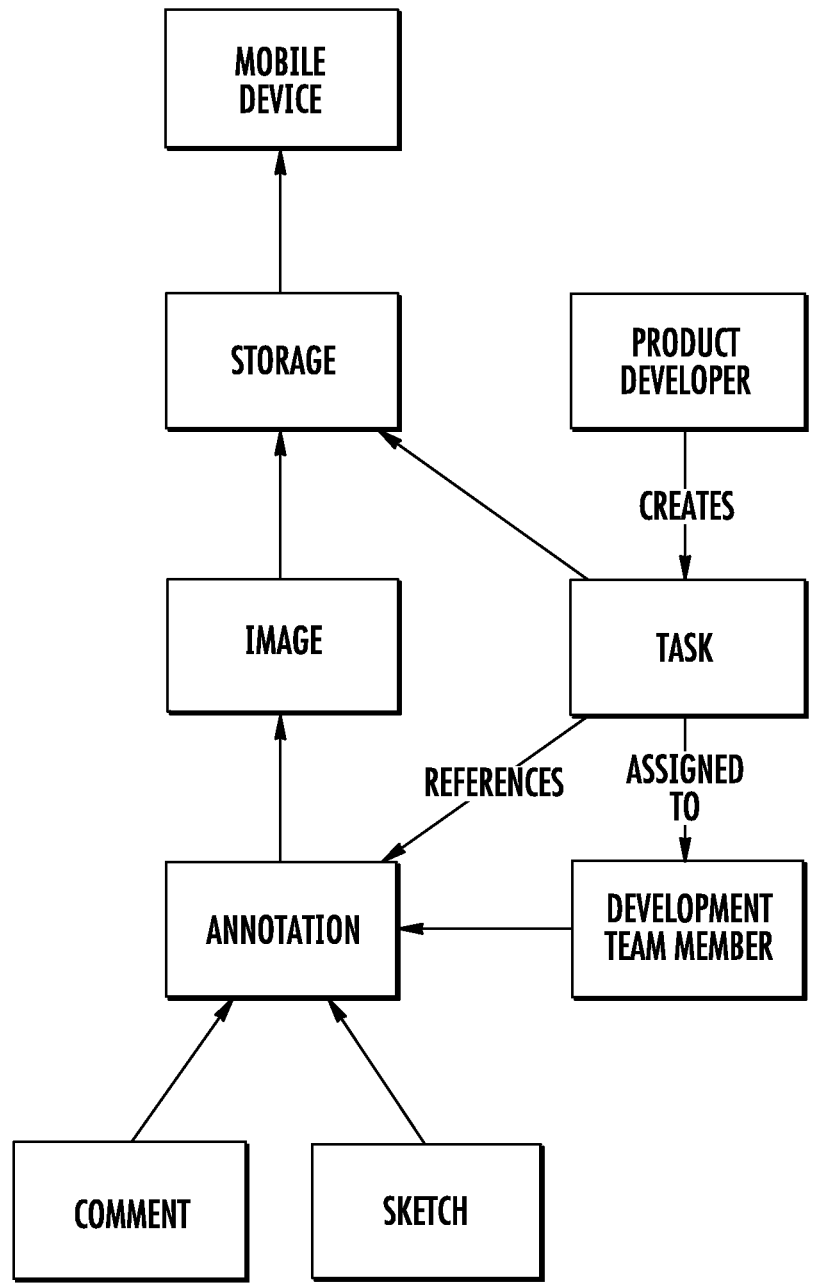

FIG. 19 shows assigning of tasks of the mobile app. Typically the user (e.g., product developer) has taken a picture is taken for a particular product (e.g., a prototype) being reviewing. The user may be in the field, such as at a factory in another country (e.g., China) away from the developer's desk (e.g., San Francisco). The user notices a problem in a product prototype that needs to be corrected, takes a picture (e.g., using a smartphone) to show the problem, and annotates it.

Without needing to return to a desktop, the user can use the mobile app to create and assign a task to another development team member. The task can be stored in storage of the mobile device and references the image and annotations, so that the development member can address the problem to be corrected.

Figure 20:
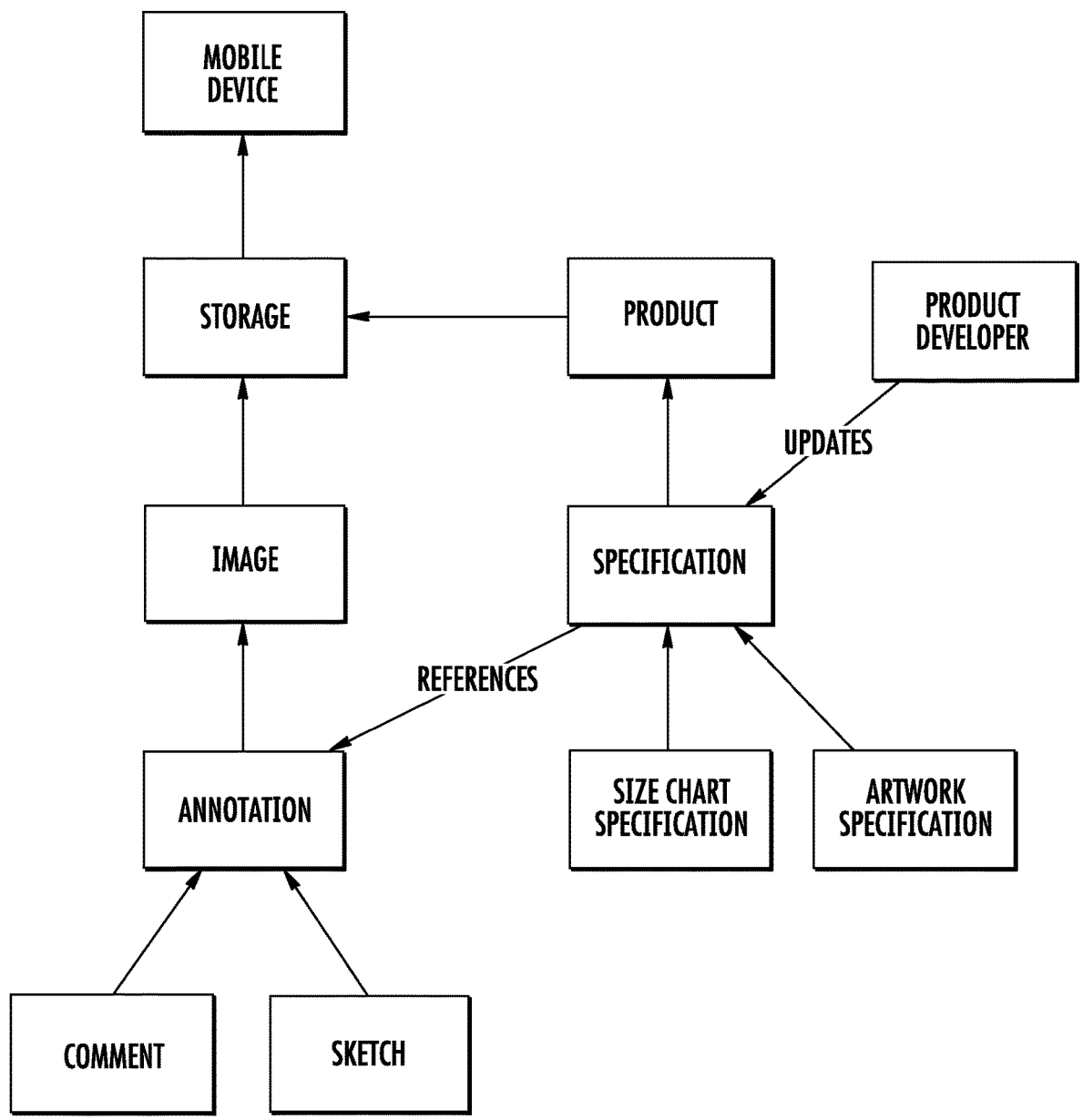

FIG. 20 shows the mobile app allowing the user to access a product's specifications. On a mobile device, the user can select a product and view the specifications for the product. These specifications are pulled from the cloud. Some examples of specifications include a size chart specification (e.g., for clothing products), artwork specifications (e.g., for logos), and others. With the specifications, the user can view the product and compare to the written specifications to determine whether some aspect of a product prototype does not meet specification.

Figure 21:
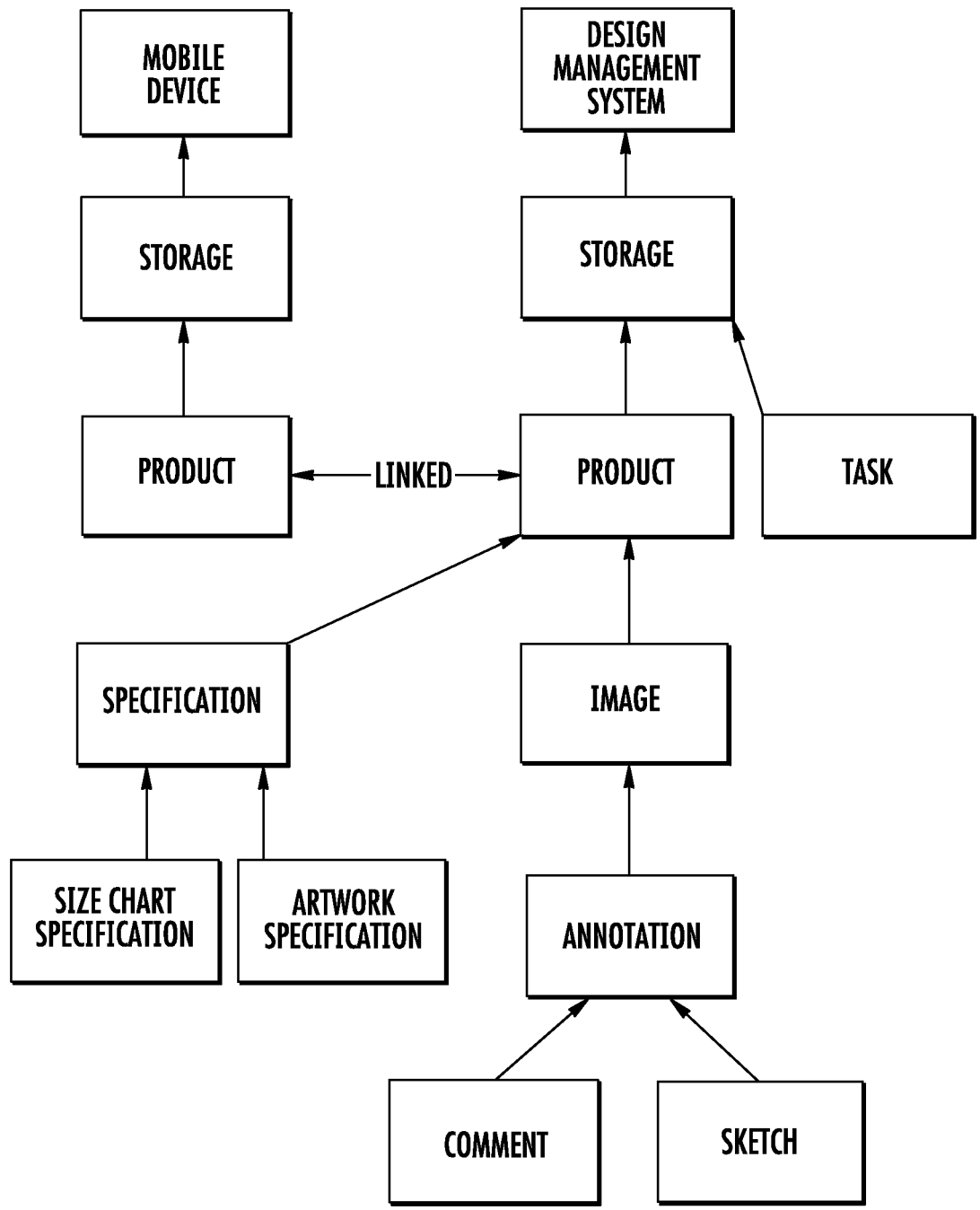

FIG. 21 shows how the mobile app is linked to the design management system. The design management system is stored on a server (which may be referred to as the cloud), and the mobile app can link or product stored in the design management system via the cloud. Typically mobile app is on a smartphone that accesses the cloud wirelessly. Operations and information on the mobile device are synchronized with the cloud.

In an implementation, the mobile app has an off-line mode. When the user anticipates not having wireless connectivity, the user can specify off-line mode and specific aspects of a product to download and store on the mobile device. Then the user can view specification, take pictures, make annotations, and assign tasks, just as thought the mobile device were connected. When the phone becomes connected to the cloud again, the phone will synchronize with design management system wirelessly. The changes the user made on the mobile app will be reflected in the design management system. Users at the desktop will see the images, annotations, tasks, or other changes.

Figure 22:
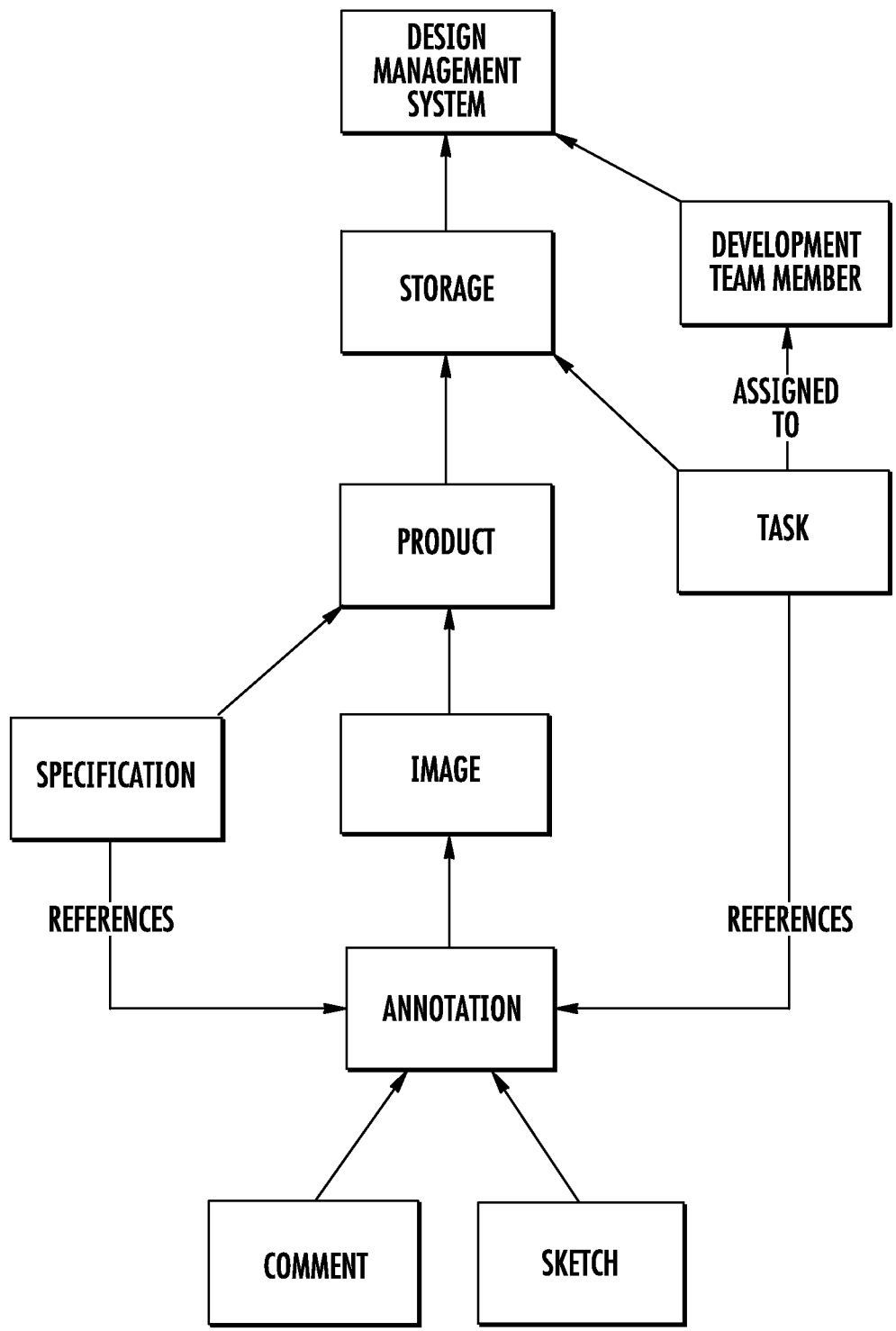

FIG. 22 shows a design management system. The system has storage (e.g., hard disk). Products and images with or without annotations for a product are stored on the physical storage devices of the system. The product has a specification which details attributes of the product Annotations, such as comments or sketches, can reference the specification. Project tasks are assigned to team member are also stored in storage. These tasks can reference annotations too.

Figure 23:
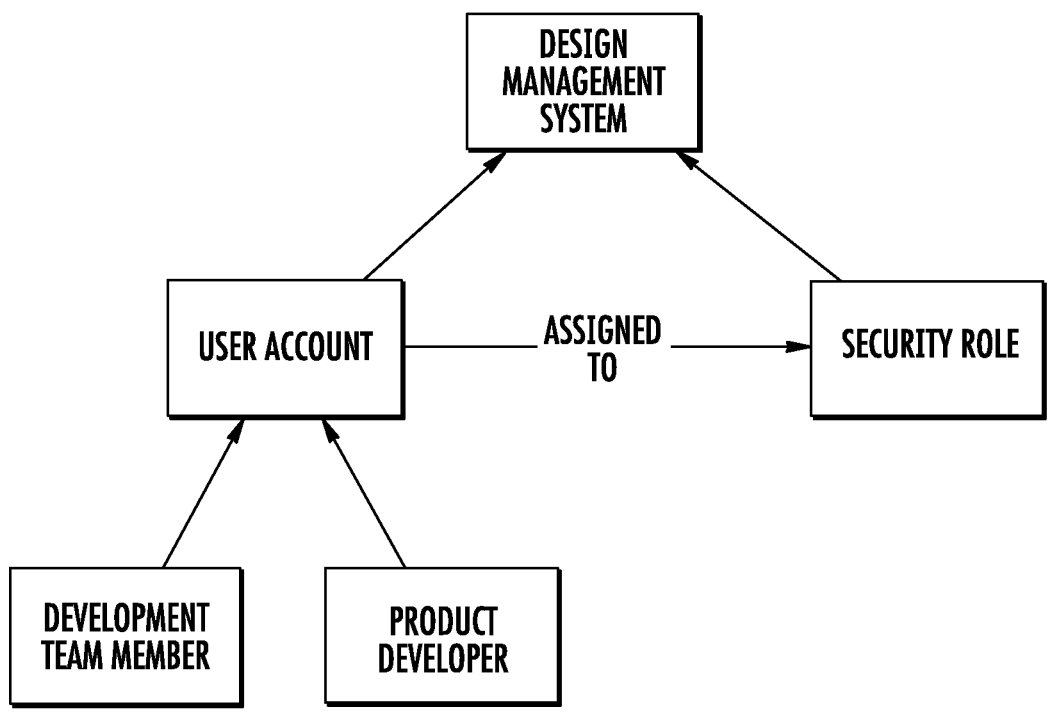

FIG. 23 shows security roles of the design management system. There are user accounts in the design management system. Some users include product developers and development team members. Each user account can be assigned a security role.

Some security roles or attributes include create, read, update, and delete. Information of the design management system can be protected using such attributes. A system administrator or person in charge of a particular product project can assign or edit security attributes for each user for information of the system. These roles can include (1) create and delete privilege, (2) read only privilege, and (3) edit privilege.

For create and delete privilege, the user can create and delete information on the system (e.g., create a task or delete a task). For read only privilege, the user can only view information (e.g., view an image). For edit privilege, the user can make edits to information (e.g., make annotations to an image).

Figure 24:
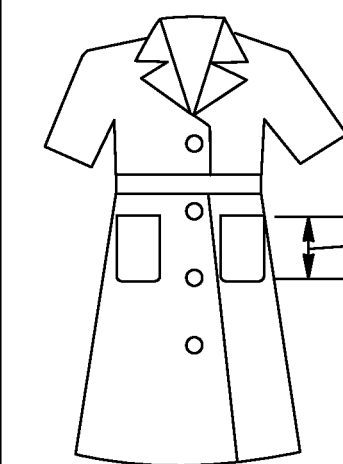

FIG. 24 shows a wire frame of a task assignment screen of the mobile app. Using this screen, the user can select an image and add an annotation (using select image and add annotation buttons). The picture can be a dress, and the annotation to change the pocket height from 6 inches to 5.5 inches. This may have been a mistake in the product prototype versus the specification.

In the task assignment screen, the user can select (with the select button) another user to assign the task. There is a text box for the task description. The user can select (with the select date button) a due date and also change status using a change status button.

Figure 26:
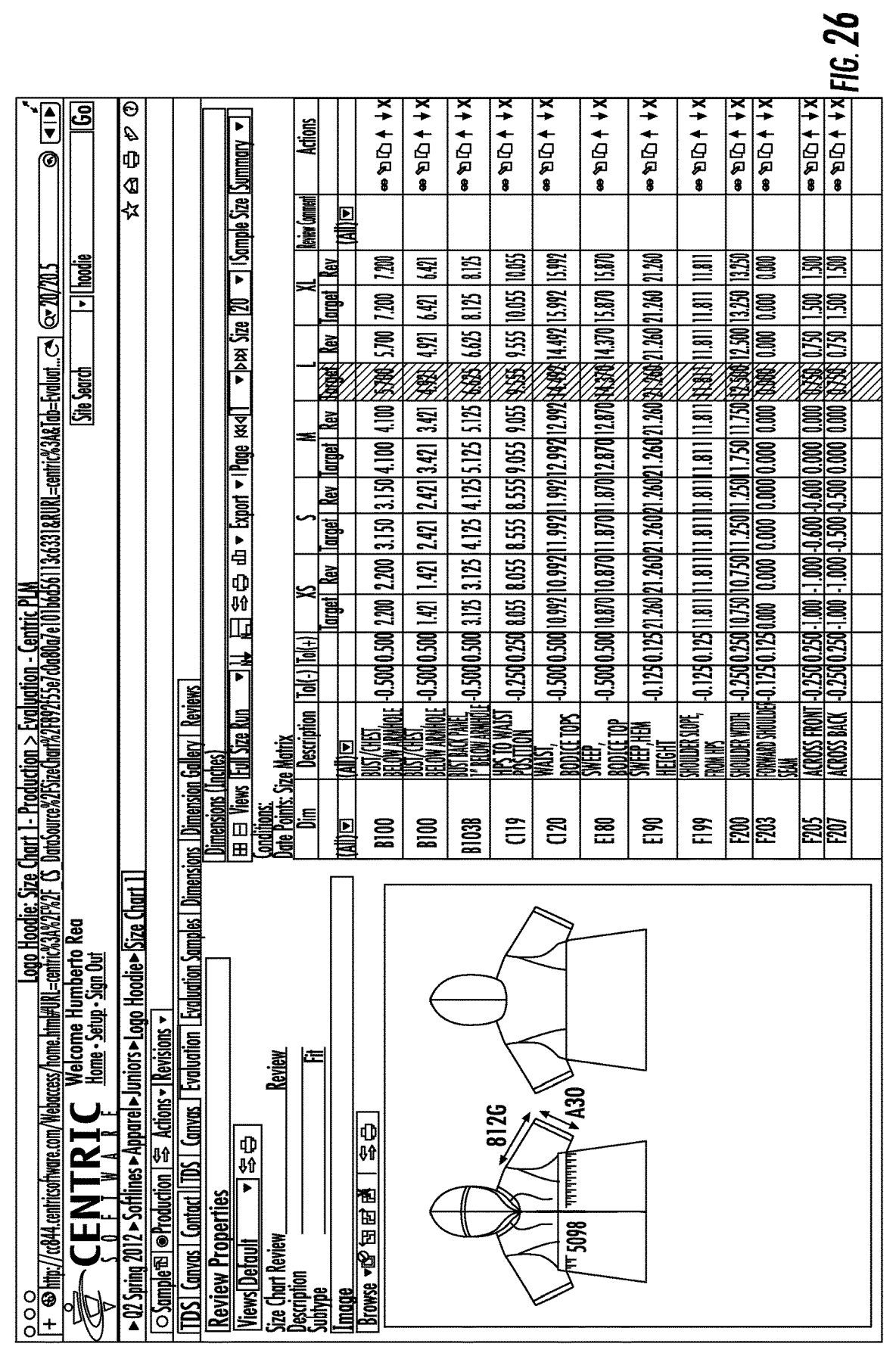

FIG. 25 shows a wire frame of a size specification review screen for the mobile app. The specification shows a picture of the product and a table below the picture. The table has a columns for measurement point, specification, actual, and percentage different between specification and actual. There is a camera button, so that the user can take a picture as desired. For example FIG. 26 shows a desktop size chart review screen. Using this screen, the user can review size specifications for different dimensions of a clothing product. There are columns for dimension, description, plus tolerance, minus tolerance, and target values for each of the sizes. Some examples of sizes include extra small (XS), small (S), medium (M), large (L), and extra large (XL).

Some specific flows for operating an design management system are presented below, but it should be understood that the invention is not limited to the specific flows and steps presented. A flow of the invention may have additional steps (not necessarily described in this application), different steps which replace some of the steps presented, fewer steps or a subset of the steps presented, or steps in a different order than presented, or any combination of these. Further, the steps in other implementations of the invention may not be exactly the same as the steps presented and may be modified or altered as appropriate for a particular application or based on the data. Steps of a flow include:

(1) Providing a design management system, where the design management system is accessible via the Internet or other network. The design management system can be implemented uses one or more servers accessible via the cloud.

(2) Providing a mobile application for a smartphone (or other mobile device) having a camera and wireless connectivity to the Internet or other network. A user of the mobile application can remotely access the design management framework system via the network.

(3) Using the mobile application executing on the smartphone, allowing a first user of the design management system to take picture. The mobile application can turn on the camera of the mobile device. A picture can be data and the image saved in storage of the smartphone. The image can be in an image format such as JPEG, EXIF, TIFF, RAW, PNG, GIF, BMP, or other.

(4) Allowing a first user to make an annotation to the picture. The mobile application has tools for the user to annotate the picture with text or graphically (e.g., freehand drawing). For example the user can put straight lines, curved lines, boxes, and circles on the picture. The user can resize the picture, crop the picture, select the fill color, select the border color, add text, add arrow heads to the end of line shapes, and change the thickness and dash size for line shapes and borders.

(5) Synchronizing the mobile application with the design management system. This can include uploading the picture with annotation to the design management system. The uploading the picture with annotation to the design management system can be a synchronization that occurs without being request by the first user. The mobile application can periodically synchronize with the design management system server.

Once data is synchronized and uploaded, users accessing the design management system via a desktop interface (e.g., through a desktop web browser) can view the data that was edited or created at the mobile application (mobile interface).

(6) Using the mobile application, allowing the first user to create task and assign to a a second user of the design management system. The task can include a link to the picture with annotation, and text with a task description.

(7) Using the mobile application, downloading from the design management system a product specification.

As an example, the product specification can include a size specification screen including: (a) a first column having rows of measuring points; (b) a second column having rows of specification measurements associated with the measuring points; (c) a third column having rows of input boxes, for user input, for actual measurements associated with the measurement points. Each row includes a camera button which turns on a camera of the smartphone. This allows the user easy access to the camera. A fourth column having rows showing calculates of differences between specifications and actual measurements.

(8) Checking a security role of the first user at the design management system. In an implementation, allow the first user to take a picture only when a security role of the first user includes a create access attribute. In an implementation, allow the first user to make an annotation to a picture only when a security role of the first user includes an update access attribute. In an implementation, disallow the first user to make an annotation to a picture when a security role of the first user includes a read only access attribute.

In another flow, steps include:

(1) Allowing a mobile application, executing on at least one processor of a mobile device having a camera, access a server of a design management system via a wireless network. The design management system includes product specification, tasks, review for at least a first product.

(2) Using the mobile application, allowing a first user to create a task and assigning to a second user.

(3) Using the mobile application, selecting a picture to associate with the task.

(4) Automatically synchronizing the mobile application with the design management system. The synchronizing can include uploading the task to the design management system.

(5) Using the mobile application, allowing accessing of the camera of the mobile device to take the picture. The picture is saved and stored on the mobile device.

(6) Allowing attaching of a text annotation or graphical annotation to the picture. The text annotation can include one or more of: selecting the font point size, selecting the font type, selecting the font weight, and selecting an alignment for the text. The graphical annotation can include one or more of straight lines, curved lines, boxes, and circles. The graphical annotation can include one or more of resizing, selecting the fill color, selecting the border color, adding text, adding arrow heads to the end of line shapes, and changing the thickness and dash size for line shapes and borders.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:

providing a design management system, wherein the design management system is accessible via the Internet;

providing a mobile application for a mobile device having a camera and wireless connectivity to the Internet, wherein a user of the mobile application can remotely access the design management framework system over the Internet;

using the mobile application executing on the mobile device, allowing a first user of the design management system to take a first picture;

checking a security role of the first user at the design management system and when a security role of the first user includes a read only access attribute, disallowing the first user to make an annotation to the first picture;

determining that the security role of the first user includes an update access attribute and allowing the first user to make first annotation to the first picture, the first annotation to the first picture indicates a location on a first product captured in the first picture for a change to be made to the first product before manufacture, wherein the first annotation comprises a freehand graphical sketch associated with the first picture, the freehand graphical sketch is input into the mobile application via a touch screen interface of the mobile device, and the freehand graphical sketch comprises at least one of adding straight lines, curved lines, boxes, or circles on the picture;

synchronizing the mobile application with the design management system comprising uploading the first picture with annotation, comprising the freehand graphical sketch including the added straight lines, curved lines, boxes, or circles on the picture, to the design management system;

in the mobile application, providing a first task assignment screen of the mobile application to the first user;

providing a first button on the first task assignment screen for the first user to select at least one image from pictures previously uploaded to the design management system to add to a first new task;

providing a second button on the first task assignment screen for the first user to select a user to assign the first new task to;

providing a text box on the first task assignment screen for the first user to enter task instructions for the first new task;

allowing the first user to use the first button to select the first picture with the first annotation, comprising the freehand graphical sketch including the added straight lines, curved lines, boxes, or circles on the picture, for a first task;

allowing the first user to use the second button to select a second user to assign the first task; and allowing the first user to use a text box to enter task instructions.

2. The method of claim 1 wherein the annotation comprises text associated with the picture.

3. The method of claim 1 wherein the annotation comprises adding an arrow head to a line associated with the picture.

4. The method of claim 1 wherein the uploading the picture with annotation to the design management system occurs without a request by the first user.

5. The method of claim 1 comprising:
in the mobile application, providing a second task assignment screen of the mobile application to the first user, wherein the second task assignment screen comprises a product image that is not from a picture previously uploaded by the first user;
providing a first button on a second task assignment screen for the first user to make an annotation to the product image to a second new task;
providing a second button on the first task assignment screen for the first user to select a user to assign the second new task to;
providing a text box on the first task assignment screen for the first user to enter task instructions for the second new task;
allowing the first user to use the first button to make an annotation to the product image for a second task;
allowing the first user to use the second button to select a third user to assign the first task, wherein the third user is different from the second user; and
allowing the first user to use the text box to enter task instructions for the second task.

6. The method of claim 1 comprising:
using the mobile application, downloading from the design management system a product specification.

7. The method of claim 6 wherein the product specification comprises a size specification screen comprising:
a first column comprising rows of measuring points;
a second column comprising rows of specification measurements associated with the measuring points;
a third column comprising rows of input boxes, for user input, for actual measurements associated with the measurement points,
wherein each row comprises a camera button which turns on a camera of the mobile device.

8. The method of claim 7 wherein a size specification screen comprises:
a fourth column comprising rows showing calculated differences between specifications and actual measurements.

9. The method of claim 1 wherein the picture comprises a product managed by the design management system and the annotation comprises a task assigned to a second user including changes to be made to the product.

10. The method of claim 1 wherein the first new task includes an association with the first annotation and the first annotation identifies an area of an article of clothing captured by the first picture relevant to satisfying the first new task.

11. The method of claim 1 wherein the entered task instructions describes a change to be made to a product before manufacture.

12. The method of claim 1 wherein the first new task comprises changing a size of detail on a piece of apparel.

13. The method of claim 1 wherein the first new task comprises changing a position of detail on a piece of apparel.

14. The method of claim 1, wherein the first user includes a product developer role that identifies changes to be made to a product tracked by the design management system and the assigned user includes a development team member role that implements the changes to be made to a product tracked by the design management system.

15. A method comprising:
allowing a mobile application, executing on at least one processor of a mobile device comprising a camera and a touch screen, access to a server of a design management system via a wireless network, wherein the design management system comprises product specification, tasks, review for at least a first product;
via the wireless network, downloading from the design management system to the mobile application the product specification, tasks, review for at least a first product;
using the mobile application, while wireless network access is unavailable, allowing a first user to create a task and assigning to a second user comprising at least one input from the first user on the touch screen of the mobile device;
using the mobile application, while wireless network access is unavailable, selecting a picture to associate with the task;
using the mobile application, while wireless network access is unavailable, allowing the user to make a freehand graphical sketch associated with the picture associated with the task, wherein the freehand graphical sketch is input into the mobile application via a touch screen interface of the mobile device, and the freehand graphical sketch comprises at least one of adding curved lines or arrow heads to the end of line shapes on the picture, and the freehand graphical sketch indicates a location on a first product captured in the first picture for a change to be made to the first product before manufacture;
while wireless network access is unavailable, using the mobile application storing the task with freehand graphical sketch at the mobile device; and
upon wireless network access becoming available, automatically synchronizing the mobile application with the design management system comprising uploading the task with freehand graphical sketch, comprising the added curved lines or arrow heads to the end of line shapes on the picture, to the design management system.

16. The method of claim 15 comprising:
using the mobile application, allowing accessing of the camera of the mobile device to take the picture; and
saving the picture and storing on the mobile device.

17. The method of claim 16 comprising:
allowing attaching of a text annotation to the picture.

18. The method of claim 17 wherein the text annotation comprises selecting a font point size, selecting a font type, selecting a font weight, and selecting an alignment for the text.

19. The method of claim 16 comprising:
allowing attaching of a graphical annotation to the picture, wherein the graphical annotation comprises straight lines, curved lines, boxes, and circles.

20. The method of claim 19 wherein the graphical annotation comprises resizing, selecting a fill color, selecting a border color, adding text, adding arrow heads to an end of line shapes, and changing a thickness and dash size for line shapes and borders.

21. The method of claim 15 wherein the picture comprises a picture of a product in development using the design management system, and the selecting the picture to associate with the task comprises:

receiving a first indication from the first user wherein the first indication specifies a first location on the product; and receiving a second indication from the first user wherein the second indication specifies a first design change for the product at the first location.

22. The method of claim 21 further comprising:

receiving a third indication from the first user wherein the third indication specifies a second location, different than the first location, on the product; and receiving a fourth indication from the first user wherein the fourth indication specifies a second design change for the product at the second location.

23. The method of claim 15 wherein the picture associated with the task was downloaded from the design management system, and the selecting a picture to associate with the task comprises allowing attaching an annotation to the picture downloaded from the design management system, and the upon wireless network access becoming available, automatically synchronizing the mobile application with the design management system comprising uploading the task to the design management system comprises uploading to the design management system the annotation that was attached to the picture downloaded from the design management system.

24. The method of claim 15 wherein the upon wireless network access becoming available, automatically synchronizing the mobile application with the design management system comprising uploading the task to the design management system comprises downloading from the design management system a new task for the first product that was not input at the mobile device, wherein the new task is different from the task being uploaded to the design management system.

25. A method comprising:

providing a design management system, wherein the design management system is accessible via the Internet;

providing a mobile application for a mobile device having a camera and wireless connectivity to the Internet, wherein a user of the mobile application can remotely access the design management framework system over the Internet;

using the mobile application executing on the mobile device, allowing a first user of the design management system to take a first picture;

checking a security role of the first user at the design management system and when a security role of the first user includes a read only access attribute, disallowing the first user to make an annotation to the first picture;

determining that the security role of the first user includes an update access attribute and allowing the first user to make a first annotation to the first picture, wherein the first user includes a product developer role that identifies changes to be made to a product tracked by the design management system and the first annotation comprises a freehand graphical sketch associated with the first picture, the freehand graphical sketch is input into the mobile application via a touch screen interface of the mobile device, and the freehand graphical sketch comprises at least one of adding straight lines, curved lines, boxes, or circles on the picture;

synchronizing the mobile application with the design management system comprising uploading the first picture with annotation, comprising the freehand graphical sketch including the added straight lines, curved lines, boxes, or circles on the picture, to the design management system;

in the mobile application, providing a first task assignment screen of the mobile application to the first user;

providing a first button on the first task assignment screen for the first user to select at least one image from pictures previously uploaded to the design management system to add to a first new task;

providing a second button on the first task assignment screen for the first user to select a user to assign the first new task to;

providing a text box on the first task assignment screen for the first user to enter task instructions for the first new task;

allowing the first user to use the first button to select the first picture with the first annotation, comprising the freehand graphical sketch including the added straight lines, curved lines, boxes, or circles on the picture, for a first task;

allowing the first user to use the second button to select a second user to assign the first task, wherein the assigned user includes a development team member role that implements changes to be made to a product tracked by the design management system; and allowing the first user to use a text box to enter task instructions.

26. A method comprising:

providing a design management system, wherein the design management system is accessible via the Internet;

providing a mobile application for a mobile device having a camera and wireless connectivity to the Internet, wherein a user of the mobile application can remotely access the design management framework system over the Internet;

using the mobile application executing on the mobile device, allowing a first user of the design management system to take a first picture of a first piece of apparel to be managed using the design management system;

synchronizing the mobile application with the design management system comprising uploading the first picture;

synchronizing the mobile application with the design management system comprising uploading a first annotation made to the first picture of a detail found on the first piece of apparel wherein the first annotation identifies a location of the first piece of apparel captured in the first picture where a modification to the first piece of apparel is needed before manufacture of the first piece of apparel;

in the mobile application, providing a first task assignment screen of the mobile application to the first user;

providing a first button on the first task assignment screen for the first user to select at least one image from pictures previously uploaded to the design management system to add a first new task for the first piece of apparel to be completed before manufacture of the first piece of apparel;

providing a second button on the first task assignment screen for the first user to select a user to assign the first new task to;

providing a text box on the first task assignment screen for the first user to enter task instructions for the first new task;

allowing the first user to use the first button to select the first picture with the first annotation;

allowing the first user to use the second button to select a second user to assign the first task; and allowing the first user to use a text box to enter task instructions.

\* \* \* \* \*